Aug. 13, 1935. W. VAN B. ROBERTS Re. 19,668

AMPLIFIER WITH CONTROLLABLE BAND PASS WIDTH

Original Filed March 29, 1929

Inventor
WALTER VAN B. ROBERTS

By his Attorney H. T. Grover

Reissued Aug. 13, 1935 Re. 19,668

UNITED STATES PATENT OFFICE 19,668

AMPLIFIER WITH CONTROLLABLE BAND PASS WIDTH

Walter van B. Roberts, Princeton, N. J., assignor to Radio Corporation of America, a corporation of Delaware Original No. 1,907,669, dated May 9, 1933, Serial No. 350,950, March 29, 1929. Application for reissue September 28, 1934, Serial No. 746,025

20 Claims. (Cl. 250—20)

Figure 1:
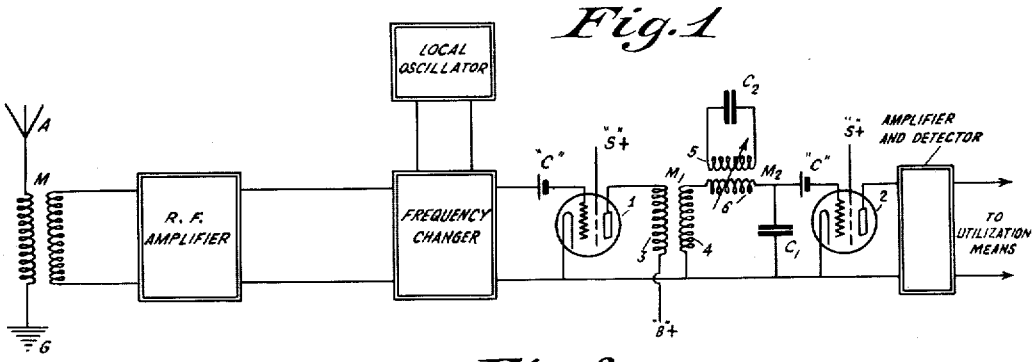

My present invention relates to amplifiers, and more particularly, to an amplifier with a controllable band pass width.

It is extremely desirable in the construction and operation of modern broadcast receiving sets, that they should pass as uniformly as possible a band of frequencies of 10 kilocycles in width, in order to preserve fidelity of signal reproduction. However, when distant or weak signals are being received, it has been found that, it is often more advantageous to sacrifice some fidelity, by decreasing the band of frequencies passed, inasmuch as this expedient eliminates considerable interference.

Now, I have discovered a method for making a broadcast receiving circuit sharply selective and very sensitive at the same time, or less sensitive but having band pass characteristics most favorable to fidelity, the method including the automatic reduction of the amplification in proportion to the increase of fidelity, as great fidelity is usually useful only on fairly strong signals.

Accordingly, it is one of the main objects of my present invention to provide an amplifier to be used in connection with tuned radio frequency receivers or intermediate frequency amplification in superheterodyne circuits, which amplifier includes means for adjusting the fidelity of signal reproduction, and means for automatically adjusting the sensitivity of the amplifier in accordance with the width of the band of frequencies passed.

Another important object of the invention is to provide a coupling means between one or more stages of amplification in a receiving circuit, which coupling means includes an essential and an auxiliary circuit, the coupling between the latter two circuits being adjustable whereby the selecting characteristic of each stage is broadened and the amount of amplification automatically reduced.

The novel features which I believe to be characteristic of my invention are set forth in particularity in the appended claims, the invention itself, however, as to both its organization and method of operation will best be understood by reference to the following description taken in connection with the drawing in which I have indicated diagrammatically one circuit organization whereby my invention may be carried into effect.

Figure 2:
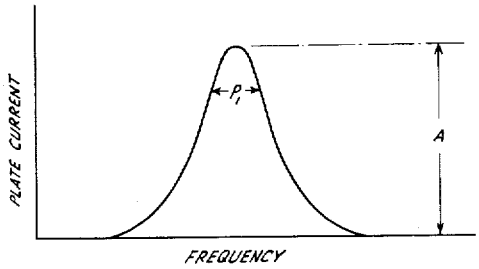
Figure 3:
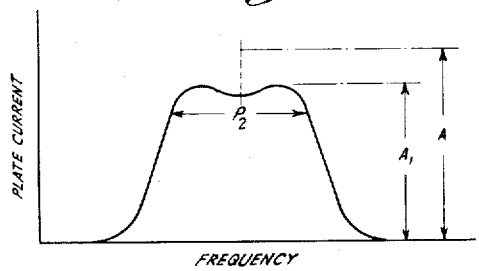
Figure 4:
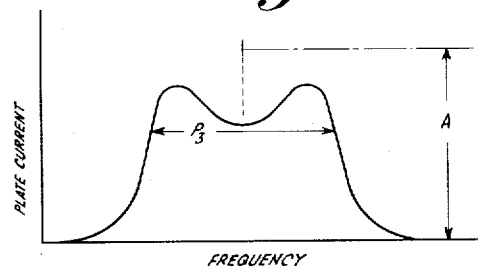

In the drawing,

Figure 1 shows diagrammatically a superheterodyne circuit embodying my invention, Figure 2 is a graphic representation of the operation of the amplifier in Figure 1, without my invention, Figure 3 is a graphic representation of the operation of the amplifier in Figure 1, including my invention, Figure 4 shows graphically the operation of the amplifier of the circuit of Figure 1 to accentuate the high frequency components of the band.

Referring to the circuit shown in Figure 1, the grounded antenna circuit A, G is coupled as at M, to the usual radio frequency amplifier, the amplified output of the latter being impressed upon the input of a frequency changing element, it being understood that the latter element has impressed upon it the output from a local oscillator.

The intermediate frequency from the frequency changer is amplified in an intermediate frequency amplifier, the latter comprising one or more stages of amplification as desired, the amplified output therefrom being detected and utilized in any well known manner, which may be phones, a loud speaker, and the like.

My invention includes an adjustment inserted in the coupling means between successive tubes in the intermediate frequency amplifier and detector unit, it being understood that the hereinafter disclosure, while specifically discussed with reference to intermediate frequency amplifiers of superheterodynes, is also operative in case of tuned radio frequency receivers. The intermediate frequency amplifier, shown in Figure 1, includes a tube 1, of the well known screen-grid type, the input circuit of which has impressed upon it the output from the frequency changer, the screen element of said tube being biased by a potential source "S".

The plate circuit of the tube is energized by a source "B", the output of the tube being impressed upon the input circuit of a second screen-grid tube 2, the screen element of which is also biased by a source "S".

The grid elements of the tubes 1 and 2 are biased by a source "C", the input circuit of the tube 2 including the secondary coil 4 of the coupling $M_1$, coil 6, and a capacity $C_1$. A resonant circuit, hereinafter called the "auxiliary circuit" comprising a coil 5 and a capacity $C_2$, is variably coupled to the input circuit by virtue of variable mutual inductance $M_2$ between coils 5 and 6.

It should be noted that coil 5 is preferably not coupled to coil 4. So long as this is avoided, coils 4 and 6 may be physically the same coil, coils 3 and 5 having no mutual inductance with each other, but both being coupled to the input circuit. The plate circuit of the tube 2 is energized by a source "B", the amplified output of the tube 2 being detected and utilized as described heretofore. I find it satisfactory to utilize a "B" source of 90 volts, and "S" source of 45 volts.

The input circuit of tube 2 and auxiliary circuit are both tuned to the frequency which is to be amplified. If the coupling of the auxiliary circuit to the input circuit is made zero the amplification of the amplifier system will be a simple resonance curve as shown in Figure 2, and several stages of amplification will consequently result in an extremely narrow band, for example of width $P_1$, it being, additionally, noted that by proper choice of $M_1$ the amplification with such interstage couplers may be made the maximum of which the tubes 1 and 2 are capable. In Figure 2 I have assigned an arbitrary value A to the amplification secured when my adjustment is not employed.

On the other hand, if $M_2$ is increased from zero by the proper amount, the selecting characteristic of the stage is broadened, and rendered approximately flat-topped, as shown in Figure 3, and the amount of amplification secured is also reduced. The value $A_1$, in Figure 3, shows the amount of amplification secured with the auxiliary circuit 5, $C_2$ adjustably coupled by the proper amount to the input circuit of tube 2.

It will also be noted that the width of the band frequencies now passed with approximate uniformity has been increased to a value $P_2$ which is considerably broader than the value $P_1$. Inasmuch as good fidelity is only useful on fairly strong signals, it is a distinct advantage to reduce the amplification in proportion as the fidelity is increased, and as shown in Figure 3 my invention automatically provides this compensation.

If for any reason there is a lack of high audio frequency response in the loud speaker (this might be caused, for example, by the use of grid leak and condenser detection or by the selecting systems in the radio frequency selector) such lack of high audio frequency output may be compensated by increasing the coupling $M_2$ shown in Figure 1 until the selecting characteristic is as shown in Figure 4, which depicts the accentuation of the high frequency components of the band of frequencies passed.

In Figure 4 the width of the band passed has been increased to $P_3$, thus including and accentuating the high frequencies desired.

My invention differs basically from the use of loosely coupled tuned circuits such as often employed in superheterodyne circuits, in that with the present system the ability to reject interference of a considerably different frequency from the desired signal frequency, is not greater than the ability of a single tuned circuit. This disadvantage, however, is not grave, because several stages of amplification, each with a single tuned circuit, are sufficiently selective, especially when the selection provided by the radio frequency circuits is considered.

It may also be pointed out, that an additional advantage of the present adjustment, is the increased amplification secured as the selectivity is increased by loosening the coupling. It will be observed that this is contrary to the operation in the type of superheterodyne circuit mentioned above, where a loosening of the coupling between circuits results in a reduction of amplification accompanying increasing selectivity.

As stated heretofore, a plurality of stages of amplification may be used in the intermediate frequency amplifier, shown in Figure 1, and a uni-control device can be employed to vary the couplings between the input or essential and auxiliary circuits simultaneously.

It will thus be seen that I have devised a method of, and means for, making a receiving circuit sharply selective and very sensitive at the same time, or less sensitive but having band pass characteristics most favorable to fidelity, the means involving an adjustment associated with the couplings between the tuned stages of the amplifier and auxiliary tuned circuits.

While I have indicated and described only one system for carrying my invention into effect, it will be apparent to one skilled in the art that my invention is by no means limited to the particular organization shown and described, but that many modifications in the circuit arrangement, as well as in the apparatus employed, may be made without departing from the scope of my invention as set forth in the appended claims.

What I claim is:

1. An amplifier comprising one or more stages of amplification free of any tendency to oscillate, coupling means between each stage, each coupling means including an essential and an auxiliary circuit, the coupling between the latter two circuits being adjustable and so adjusted that the sensitivity of each stage is automatically reduced when the selectivity is decreased.

2. An amplifier comprising a plurality of stages of amplification free of any tendency to oscillate, coupling means between each stage, each coupling including means adjustably associated therewith for automatically reducing the sensitivity of a stage when the selectivity of the latter is decreased.

3. A coupling for a stage of amplification free of any tendency to oscillate comprising an essential circuit in the input of said stage, and an auxiliary circuit adjustably coupled to the essential circuit and so adjusted relative thereto that the sensitivity of the stage is automatically reduced when the selectivity of the latter is decreased.

4. The method of controlling the selectivity of a high frequency amplifier including at least two stages of amplification in cascade, which consists in coupling a resonant circuit to the coupling between said stages, and varying the coupling between said resonant circuit and said interstage coupling to secure an inverse relation between the frequency band width transmitted through the amplifier and the amplification of the band.

5. The method of controlling the selectivity of an intermediate frequency amplifier including at least two stages of amplification in cascade, which consists in coupling a resonant circuit to the coupling between said stages, and varying the coupling between said resonant circuit and said interstage coupling while maintaining said interstage coupling fixedly tuned to said intermediate frequency to secure an inverse relation between the intermediate frequency band width transmitted through the amplifier and the amplification of the band.

6. A method of operating a receiver including a high frequency amplifier provided with an input circuit resonant to the frequencies to be amplified, which consists in selectively varying the characteristics of said input circuit to secure an inverse relation between the frequency band width transmitted through the amplifier and the amplification of the band.

7. A method of operating a superheterodyne receiver including an intermediate frequency amplifier provided with an input circuit resonant to the frequencies to be amplified, which consists in selectively varying the characteristics of said input circuit to secure an inverse relation between the frequency band width transmitted through the amplifier and the amplification of the band while maintaining said input circuit resonant to said frequencies at all times.

8. A superheterodyne receiver including an intermediate frequency amplifier network between the first and second detectors, said network comprising a tube having a tuned input circuit resonant to the operating intermediate frequency, said circuit including at least one coil and a condenser, a tube preceding said circuit and including a coil in its plate circuit magnetically coupled to said tuned circuit, a resonant absorption circuit coupled to said tuned circuit, said absorption circuit being tuned to said intermediate frequency, said absorption circuit comprising at least a coil and condenser, said last coil being magnetically coupled to said tuned circuit coil, and means for regulating the degree of selectivity of said receiver comprising a device for adjusting the reaction of said absorption circuit on said tuned circuit.

9. A superheterodyne receiver including a selective coupling network for transmitting intermediate frequency currents from one tube to the next, an absorption circuit tuned to the intermediate frequency and electrically associated with said coupling network, and means for varying the reaction of said absorption circuit upon the coupling network.

10. In a receiver as defined in claim 9, said absorption circuit comprising at least a coil and condenser, and said varying means being operatively associated with at least said absorption circuit.

11. In a receiver as defined in claim 9, said coupling network including at least one tuned circuit magnetically coupled to the absorption circuit.

12. A superheterodyne receiver including a selective coupling system for transforming intermediate frequency currents from one tube to the next, an absorption circuit tuned to the intermediate frequency and associated with said selective system, and means for varying the reaction of said absorption system upon said selective system for the purpose of varying the width of the band of intermediate frequencies passed by said selective system.

13. In a receiver of the superheterodyne type, and in combination with the intermediate frequency transmission network thereof, a device for adjusting the degree of selectivity of the receiver, said device comprising a signal energy absorption network reactively coupled to the transmission network, and means for varying at will the absorption effect of said absorption network.

14. In a receiver of the superheterodyne type, and in combination with the intermediate frequency transmission network thereof, a device for adjusting the degree of selectivity of the receiver, said device comprising a signal energy absorption network tuned to the frequency of said transmission network reactively coupled to the transmission network, and means for varying at will the absorption effect of said absorption network.

15. In a receiver of the superheterodyne type, and in combination with the intermediate frequency transmission network thereof, a device for adjusting the degree of selectivity of the receiver, said device comprising a signal energy absorption network reactively coupled to the transmission network, and means independent of the receiver station selector for varying at will the absorption effect of said absorption network.

16. In combination with the intermediate frequency network of a superheterodyne receiver, a device for regulating at will the degree of selectivity of the receiver, said device comprising a resonant circuit tuned to the intermediate frequency and coupled to said network, and means for adjusting the absorption of intermediate frequency energy from said network by said resonant circuit.

17. In a device of the type defined in claim 16, said adjusting means being chosen to vary said absorption from substantially zero to a magnitude sufficient to impart a broad selectivity characteristic to said network.

18. In a device of the type defined in claim 16, said resonant circuit being reactively coupled to the network, and said absorption adjusting means being capable of adjustment without effect on the tuning of said network and said resonant circuit.

19. The method of operating a receiver of the superheterodyne type including an intermediate frequency amplifier provided with an input circuit resonant to the intermediate frequency employed, which includes selectively absorbing intermediate frequency energy from the said input circuit, and varying the said absorption to adjust the degree of selectivity of said input circuit.

20. In a method as defined in claim 19, increasing the absorption of said intermediate frequency energy to render the input circuit broadly resonant, and decreasing the absorption to sharpen the tuning of the input circuit.

WALTER VAN B. ROBERTS.